United States Patent [19]

Lee

[11] Patent Number: 5,751,044
[45] Date of Patent: May 12, 1998

[54] MANUFACTURE DEVICE OF FOUR TRANSISTOR SRAM CELL LAYOUT AND DEVICE

[75] Inventor: Jin-Yuan Lee, Hsin-Chu, Taiwan

[73] Assignee: Taiwan Semiconductor Manufacturing Company Ltd., Hsin-Chu, Taiwan

[21] Appl. No.: 899,737

[22] Filed: Jul. 24, 1997

Related U.S. Application Data

[62] Division of Ser. No. 507,139, Jul. 26, 1995, Pat. No. 5,686,336.

[51] Int. Cl.$^6$ ............................................. H01L 21/8244
[52] U.S. Cl. ......................................... 257/380; 257/904
[58] Field of Search ................. 438/238; 257/903–904, 257/379–380

[56] References Cited

U.S. PATENT DOCUMENTS

| | | | |
|---|---|---|---|
| 5,453,636 | 9/1995 | Eitan et al. | 257/378 |
| 5,461,251 | 10/1995 | Yang et al. | 257/379 |
| 5,592,011 | 1/1997 | Yang | 257/368 |

*Primary Examiner*—Jey Tsai
*Attorney, Agent, or Firm*—George O. Saile; Stephen B. Ackerman; Graham S. Jones

[57] ABSTRACT

In accordance with still another aspect of this invention, a set of cross-coupled inverters provide a bistable flip flop formed on a semiconductor substrate with a pair of FOX regions defining an area on the surface of a substrate. The substrate is composed of a semiconductor material with a pair of buried contact regions in the silicon substrate juxtaposed with the FOX regions. A control gate electrode is formed on a gate oxide layer on the surface of the substrate between the pair of the FOX regions. A source region and drain region are formed in the substrate juxtaposed with the control gate electrode to form a parasitic FET device between the FOX regions, the source region and the drain region and reaching to separate ones of the buried contact regions. An interpolysilicon dielectric layer over the control gate electrode covers the device and the power supply conductor passes over the control gate electrode.

9 Claims, 5 Drawing Sheets

MANUFACTURE DEVICE OF FOUR TRANSISTOR SRAM CELL LAYOUT AND DEVICE

This application is a divisional application of 08/507,139, filed Jul. 26, 1995, now U.S. Pat. No. 5,686,336.

BACKGROUND OF THE INVENTION

1. Field of the Invention

This invention relates to MOSFET SRAM memory devices and more particularly to SRAM devices with increased effective area of the buried contacts.

2. Description of Related Art

Static Random Access Memory (SRAM) devices are built of cross-coupled inverters forming a set of bistable flip flops which store data during the time that power remains applied. That is to say the an SRAM is designed to retain stored date indefinitely, so long as power remains applied to the device.

There is a problem that use of the continually active region in the substrate in the buried contact region, this active region in the substrate passes through the polysilicon 1 layer at the Vss voltage interconnection.

SUMMARY OF THE INVENTION

The foregoing and other aspects and advantages of this invention are explained and described below with reference to the accompanying drawings, in which:

In accordance with this invention a method is provide for fabrication of an SRAM silicon device including a plurality of FET transistors in the form of a set of cross-coupled inverters forming a bistable flip flop formed on a semiconductor substrate. The method comprises:

forming a field oxide structure on the surface of a semiconductor substrate, implanting a pair of buried contacts into the substrate, forming a first polysilicon layer on the substrate, forming a first mask and etching the first polysilicon layer to form a control gate electrode and interconnection lines to the transistors, forming spacers adjacent to the control gate electrode and the interconnection lines, forming source region and drain region in the substrate, forming a dielectric layer over the device, forming a second polysilicon layer on the dielectric layer, and forming a second mask and etching the second polysilicon layer to form a high voltage line over the gate.

Preferably, the chemical species of the dopant implanted in the local buried contacts is a material selected from the group consisting of phosphorus and arsenic, with a dose of between about 1E14 ions/cm$^{-2}$ and about 5E15 ions/cm$^{-2}$, at an energy of between about 10 keV and about 70 keV in an implanter tool.

Preferably, the chemical species of the dopant implanted in the local lightly doped implant is material selected from the group consisting of arsenic (As) and phosphorous (P), with a dose of between about 1E12 ions/cm$^{-2}$ and about 1E14 ions/cm$^{-2}$, at an energy of between about 10 kev and about 70 keV in an implanter tool.

Preferably, the chemical species of the dopant implanted in the source region and the drain region is arsenic (As), with a dose of between about 1E15 ions/cm$^{-2}$ and about 7E15 ions/cm$^{-2}$, at an energy of between about 10 keV and about 70 keV in an implanter tool.

Preferably, the control gate electrode is connected to ground.

In accordance with another aspect of this invention, an SRAM silicon device comprising a set of cross-coupled inverters forming a bistable flip flop formed on a semiconductor substrate with a pair of FOX regions formed defining an area on the surface of a substrate. The substrate is composed of a semiconductor material. The device includes as follows:

a pair of buried contact regions in the silicon substrate juxtaposed with the FOX regions, a control gate electrode formed on a gate oxide layer on the surface of the substrate a source region and drain region formed in the substrate juxtaposed with the control gate electrode and reaching to the buried contact regions, an interpolysilicon dielectric above the control gate electrode covering the device, and a polysilicon conductor formed over the gate.

Preferably, the buried contacts are formed by ion implantation into the semiconductor substrate.

Preferably, the gate oxide was formed on the substrate prior to formation of the gate.

Preferably, the control gate electrode is connected to ground.

It is further preferred that the control gate electrode of the transistor is connected to ground and the source and drain thereof are connected transversely in the device whereby the transistor is always off because its control gate electrode is at ground whereby there is no current flow and no short circuit.

In accordance with still another aspect of this invention, a set of cross-coupled inverters forming a bistable flip flop formed on a semiconductor substrate with a pair of FOX regions formed defining an area on the surface of a substrate. The substrate is composed of a semiconductor material wherein:

a pair of buried contact regions in the silicon substrate juxtaposed with the FOX regions, a control gate electrode formed on a gate oxide layer on the surface of the substrate between the pair of the FOX regions, a source region and drain region formed in the substrate juxtaposed with the control gate electrode to form a parasitic FET device between the FOX regions, the source region and the drain region and reaching to separate ones of the buried contact regions, an interpolysilicon dielectric above the control gate electrode covering the device, and a conductor formed over the control gate electrode.

Preferably, the conductor formed over the control gate electrode comprises the Vcc line of the device.

Preferably, the device includes eight other FET device in the flip flop in addition to the parasitic FET device.

Preferably, the conductor formed over the control gate electrode comprises the Vcc line of the device.

DESCRIPTION OF THE PROBLEM

Figure 1:
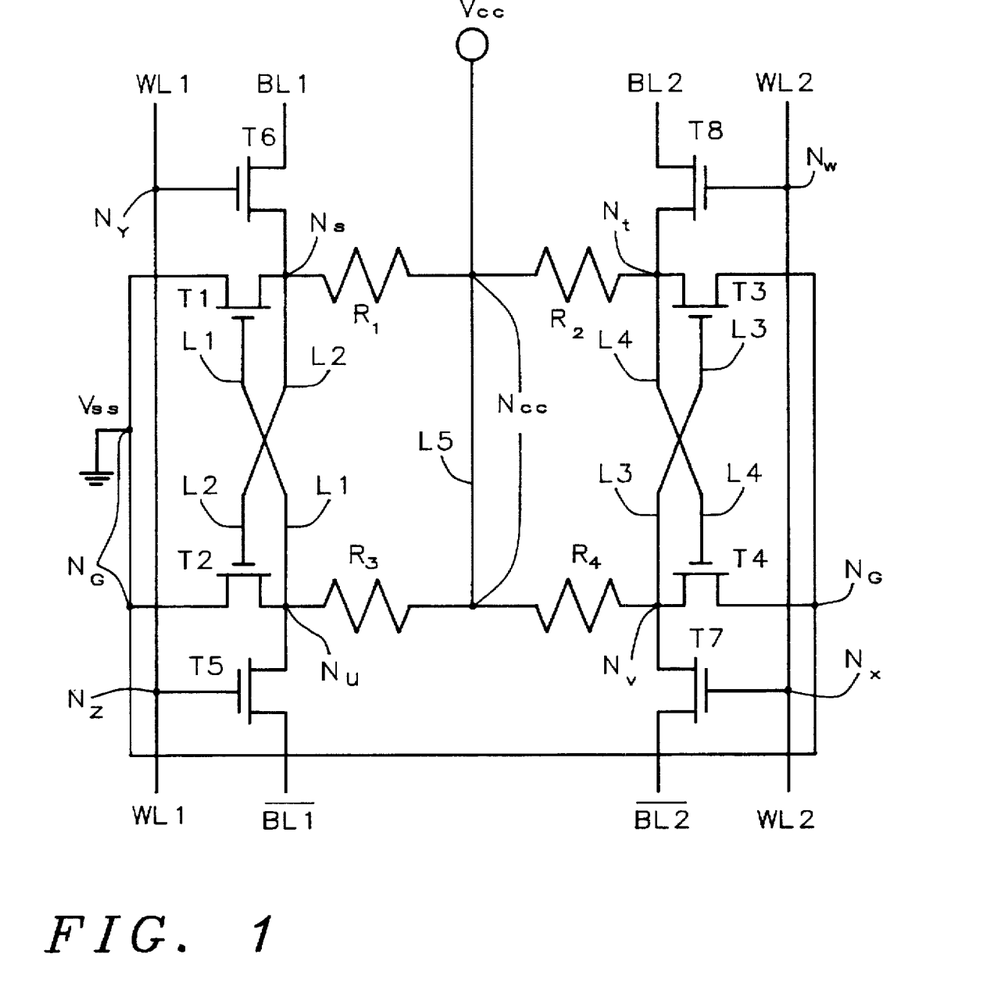
FIG. 1 shows a schematic circuit diagram of a device which illustrates a problem to be overcome in SRAM cells.

FIG. 1 shows a schematic circuit diagram of a device which illustrates a problem to be overcome in SRAM cells.

Figure 3:
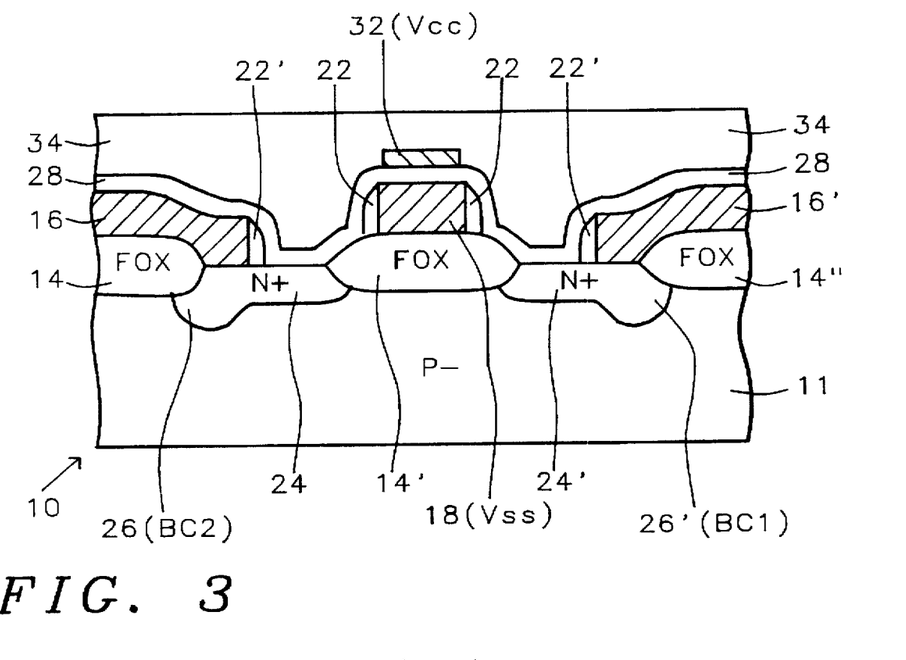
FIG. 3 shows a view of the device of FIG. 1, which is a section taken along line 3-3' in FIG. 5.
Figure 5:
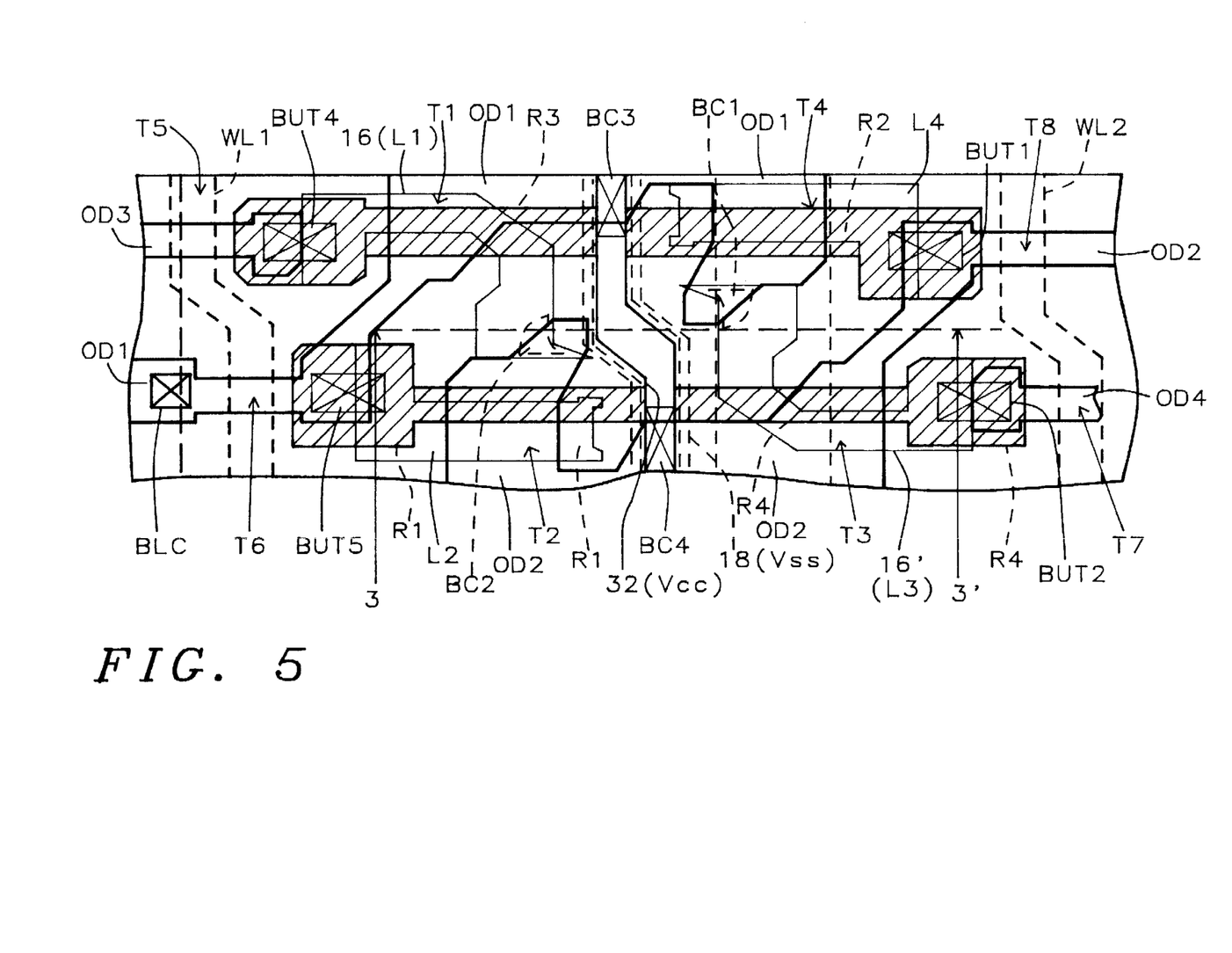
FIG. 5 shows a schematic plan view of the structure of an embodiment of the device of FIG. 1.

FIG. 3 shows a view of the device of FIG. 1, which is a section taken along line 3-3' in FIG. 5.

FIG. 5 shows a schematic plan view of the structure of the device of FIG. 1.

Referring to FIG. 1, supply voltage Vcc is connected to central node $N_{cc}$, which is connected via "joining" line L5 to one end of each of four resistors $R_1$, $R_2$, $R_3$, and $R_4$. In FIGS. 5 the four resistors $R_1$, $R_2$, $R_3$, and $R_4$ are shown formed of a polysilicon 2 (poly 2) layer which has been patterned to form the four resistors $R_1$, $R_2$, $R_3$, and $R_4$ in a conventional manner.

Node $N_{cc}$ is connected along line L5 to the ends of the resistors $R_1$, $R_2$, $R_3$, and $R_4$ by means of the polysilicon 2 (poly 2) layer doped with N- type impurity. The other ends of resistors $R_1$, $R_2$, $R_3$, and $R_4$ (i.e. the opposite ends from the central node $N_{cc}$) are connected to nodes $N_r$, $N_t$, $N_u$, and $N_v$, respectively. The drains of FET devices T1, T3, T4 and T2 are connected respectively to nodes $N_2$, $N_r$, $N_u$, and $N_v$.

The sources of FET transistors T1, T3, T4 and T2 are all connected to node $N_G$, which is connected to the reference potential Vss (hereinafter referred to as ground.) Note that the node $N_G$ includes lines shown in FIG. 1 extending about the perimeter of the device which are formed from the polysilicon 1 layer, in the course of fabrication of the cell shown in FIGS. 3 and 5.

The control gate electrode (such an electrodes is referred to hereinafter as "gate") of transistor T1 is connected via line L1 to node $N_u$. The gate of transistor T2 is connected via line L2 to node $N_r$. The gate of transistor T3 is connected via line L3 to node $N_v$. The gate of transistor T4 is connected via line L4 to node $N_t$. The lines L1 to L4 are composed of material from the polysilicon 1 layer in the course of fabrication of the cell, which leads to a cross line of lines L1 and L2 on the left and lines L3 and L4 on the right.

The nodes $N_r$, $N_t$, $N_u$, and $N_v$ (which are connected to resistors $R_1$, $R_2$, $R_3$, and $R_4$, as stated above) are also connected respectively to the drains of transistors T6, T8, T5 and T7 through doped, active regions in the substrate of the device. The sources of transistors T5, T6, T7 and T8 are connected to bit lines $\overline{BL1}$, BL1, $\overline{BL2}$, BL2 respectively.

The gates of transistors T5 and T6 are connected at nodes $N_z$ and $N_y$ to word line WL1.

The gates of transistors T7 and T8 are connected at nodes $N_x$ and $N_w$ to word line WL2.

It should be noted that all of the gates of all of the transistors T1, T2, T3, T4, T5, T6, T7 and T8 are composed of material from the polysilicon 1 layer which have been formed in the course of fabrication of the gates in forming the overall cell. There is a cross-over of line L1 and line L2 and a similar cross-over of line L3 and line L4 all of which are formed of the polysilicon 1 layer and active region. Lines L1 and L2 are always at different voltage levels. Lines L3 and L4 are also always at different voltage levels.

Referring again to the sectional view shown in FIG. 3 of a device 10, the device 10 of FIG. 1 is formed on a P- doped silicon semiconductor substrate 11. The sectional view of FIG. 3 is taken along line 3-3' in FIG. 5. FIG. 5 is a schematic plan view of those parts of the device of FIG. 1 which are most relevant to the subject invention. In FIG. 5 (and FIG. 6 as well) there is an emphasis upon the most important features of the device 10 (40) from the point of view of understanding the present invention and other details have been omitted for convenience of explanation and in view of the fact that the other details are well known to those skilled in the art. As shown in FIG. 3, on the surface of semiconductor substrate 11 are formed three field oxide (FOX) regions 14, 14' and 14" spaced along the surface of the substrate 11, with wide spaces therebetween. Above the center of the central field oxide region 14' is formed a polysilicon 1 Vss ground line 18 (node $N_G$.)

Adjacent to Vss line 18 and also formed above central field oxide region 14' are silicon dioxide spacers 22 formed by etching back a conventional spacer, silicon dioxide, dielectric material. In substrate 11, between field oxide regions 14, 14' and 14" are formed doped regions 24, 24' doped N+ terminating respectively in buried contact regions 26, 26' (BC2, BC1 respectively in FIG. 5) which doped N+. Regions 26, 26' are located at the ends of regions 24, 24' which are farthest from line 18 and central FOX region 14', adjacent to FOX regions 14 and 14" respectively.

Formed above the buried contact regions 26, 26' and FOX regions 14 and 14" are a pair of polysilicon 1 interconnection lines 16, 16' connected respectively through node $N_u$ to the gate of transistor T1 on the left over FOX region 14 and through node $N_v$ to the gate of transistor T3 on the right over FOX region 14". There are sidewalls of interconnection lines 16, 16' confronting the spacers 22, and additional spacers 22' are formed adjacent to the sidewalls of interconnection lines 16, 16'. Over the entire structure, as described above, is formed a conventional blanket interpolysilicon dielectric layer 28, preferably composed of silicon oxide (TEOS). Above the dielectric layer 28 is formed the high voltage, power supply line 32 (Vcc) formed directly above the polysilicon 1 Vss line 18 (node $N_G$.)

The entire device 10 is then covered with a blanket BPSG or BPTEOS glass layer 34.

The problem with the device as shown in FIG. 3 is that the buried contact regions 26 (BC2), 26' (BC1) are shrunk by the enchroachment of the FOX region 14' formed by LOCOS, leading to the ultimate problem, which is that there is less of a process window if there is misalignment among the active area, buried contacts and the polysilicon layer. While one could increase the size of the active contact area, that is an excessively expensive solution. Another solution to that problem is needed. The embodiment of the invention described below provides an economical solution to that problem.

FIG. 5 shows a plan view of the device 10 of FIG. 3 with the various transistors T1-T8, the active areas OD1-OD4, and resistors R1-R4 of the circuit of FIG. 1. Active area OD1 surrounds a bit line contact BLC and passes by word line WL1 where transistor T6 is located. Next, active area OD1 passes by butt contact area BUT5. Next the active area OD1 passes by resistor R3 and line L1 (16) where transistor T1 is located. Then active area OD1 passes by butt contact area BC3, which is at one end of Vss line 18 and Vcc line 32 and continues past transistor T4 towards the upper end of line L4 and ends just beyond buried contact BC1, which is one of the buried contacts which must be protected from enchroachment by FOX region 14' in FIG. 3.

The next active area, area OD2 is formed on the opposite side of Vss line 18 and Vcc line 32 where it connects to buried contact BC2, which also needs protection from enchroachment by FOX region 14'. Active area OD2 then extends across resistor R3 and line L2, where transistor T2 is formed. Then active area OD2 crosses the other end of Vss line 18 and Vcc line 32 passing by transistor T3, line L4, resistor R4 to butt contact area BUT1 and then by word line WL2 where transistor T8 is formed.

Active region OD3 passes by word line WL1 where transistor T5 is formed and ends at resistor R3 and butt contact BUT4.

DESCRIPTION OF THE PREFERRED EMBODIMENT

Figure 2:
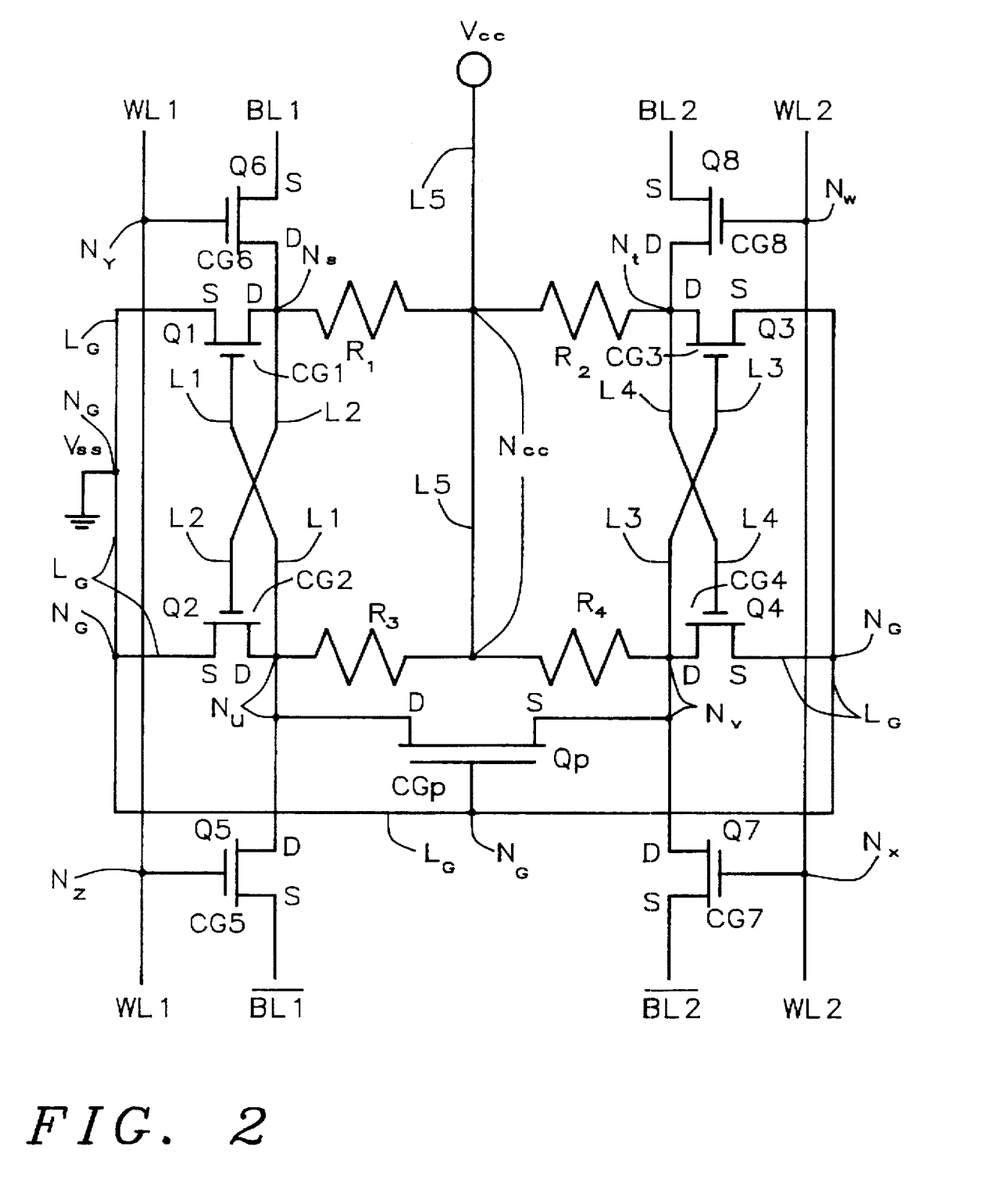
FIG. 2 shows a schematic circuit diagram of a device which illustrates an SRAM cell designed and built by a process in accordance with this invention.
Figure 4:
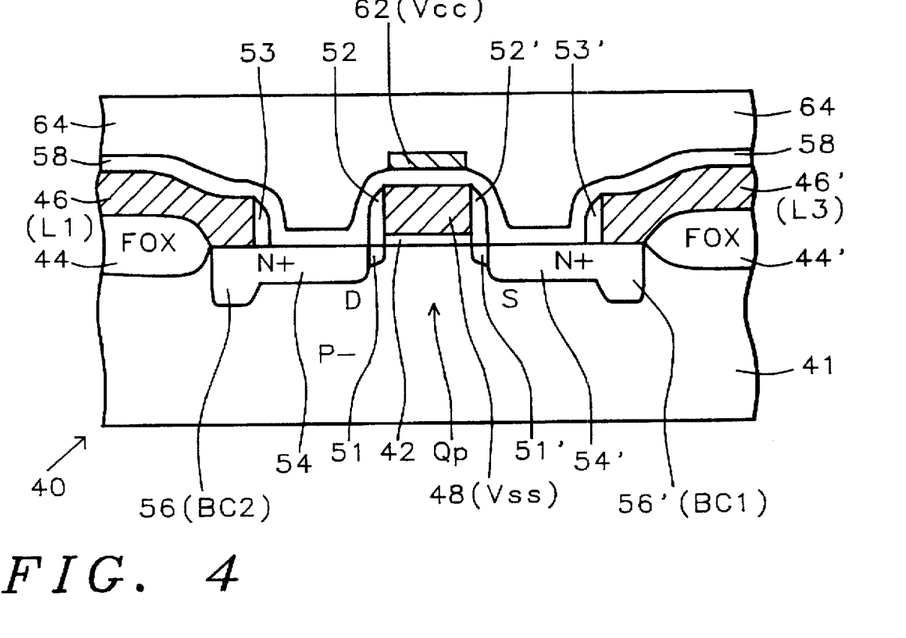
FIG. 4 shows a view of the cell of FIG. 2 which is a section taken along line 4-4' in FIG. 6.

FIG. 2 shows a schematic circuit diagram of a device (similar to FIG. 1) which illustrates an SRAM cell modified in accordance with this invention. FIG. 4 shows a section of the cell of FIG. 2 taken along line 4—4' in FIG. 6, which shows a plan view of the structure of an embodiment of the device of FIG. 2.

Referring to FIG. 2, similar devices in FIG. 2 have similar reference indicia to those seen in FIG. 1. Like connections are also labeled similarly and the circuits are in general very similar and operate in a similar manner. The supply voltage Vcc is connected to node $N_{cc}$, which is connected via "joining" line L5 to one end of each of four resistors $R_1$, $R_2$, $R_3$, and $R_4$ which are formed of a polysilicon 2 (poly 2) layer which has been patterned to form the four resistors $R_1$–$R_4$ in a conventional manner. Node $N_{cc}$ has connections along line L5 to the ends of the, resistors $R_1$–$R_4$ provided by the polysilicon 2 layer and to voltage source Vcc.

The other ends of resistors $R_1$, $R_2$, $R_3$, and $R_4$ are connected at their opposite ends from node $N_{cc}$ to nodes $N_r$, $N_t$, $N_u$, and $N_v$, respectively. Four FET devices Q1, Q3, Q2 and Q4 have drain regions which are connected respectively to nodes $N_s$, $N_t$, $N_u$, and $N_v$. The sources of FET transistors Q1, Q2, Q3 and Q4 are all connected via lines $L_G$ to node $N_G$, which is connected to the reference potential Vss (hereinafter referred to as ground.) Note that the node $N_G$ includes lines $L_G$ shown in FIG. 1 extending about the perimeter of the device which are formed from the polysilicon 1 layer, in the course of fabrication of the cell.

The control gate electrode (gate) of transistor Q1 is connected via line L1 to node $N_u$. The gate of transistor Q2 is connected via line L2 to node $N_s$. The gate of transistor Q3 is connected via line L3 to node $N_v$. The gate of transistor Q4 connects via line L4 to node $N_t$. Lines L1–L4 are formed from the polysilicon 1 layer during fabrication of the device, which leads to a cross line of lines L1 and L2 on the left and lines L3 and L4 on the right.

The nodes $N_t$ and $N_v$ are connected respectively to the drains of transistors Q8, and Q7 through doped, active regions in the substrate of the device. The sources of transistors Q7 and Q8 are connected to bit lines $\overline{BL2}$ and BL2 respectively.

The gates of transistors Q7 and Q8 are connected to word line WL2.

The gate of transistor Qp is connected to ground. The nodes $N_u$, and $N_v$ are connected respectively to the source and the drain of transistor Qp.

It should be noted that all of the gates of all of the transistors Q1–Q8, and Qp are composed of material from the polysilicon 1 layer in the course of fabrication of the cell. There is a cross-over of line L1 and line L2 and a similar cross-over of line L3 and line L4 all of which are formed of the polysilicon 1 layer active layer.

Figure 6:
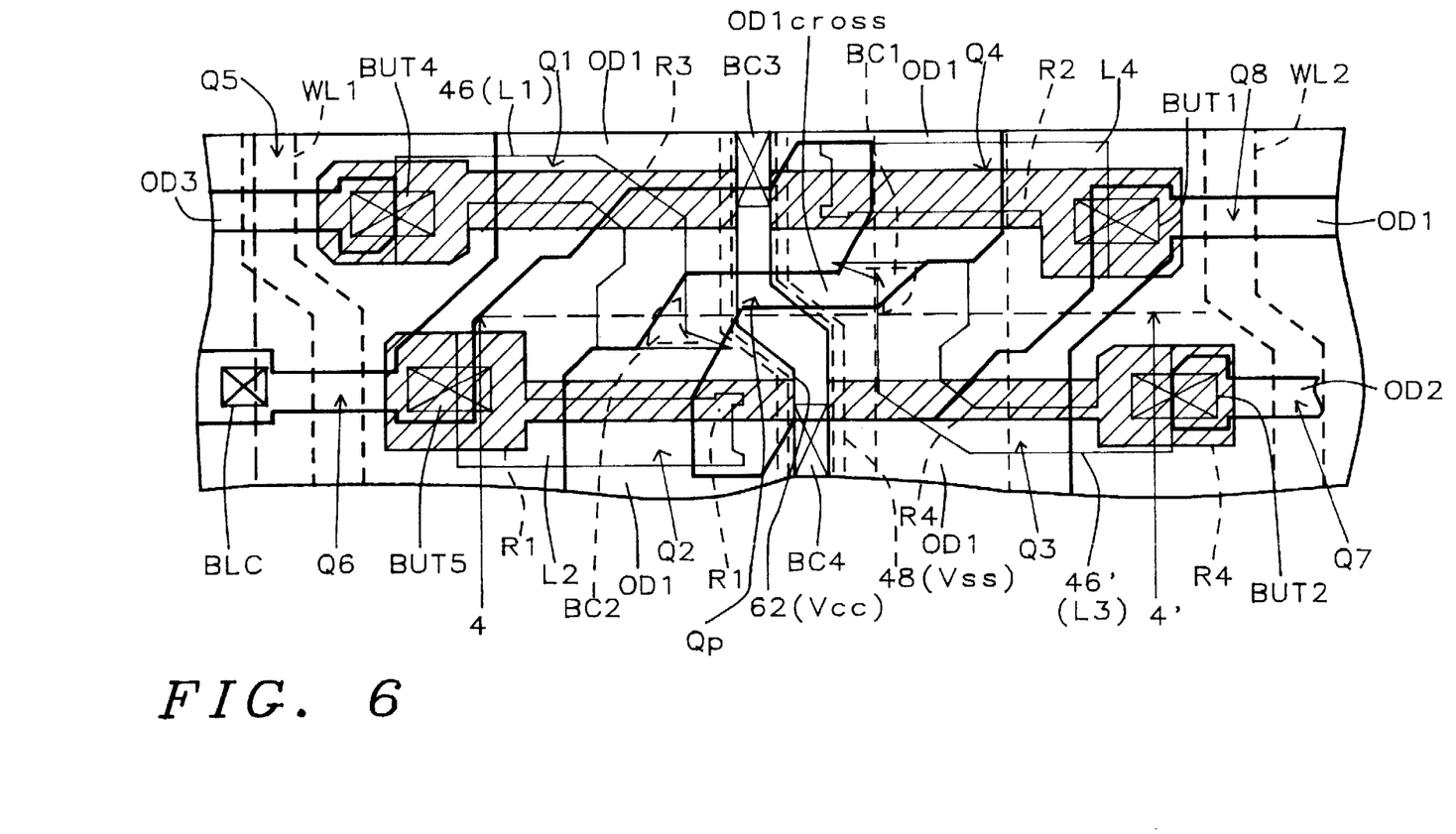
FIG. 6 shows a schematic plan view of the structure of an embodiment of the device of FIG. 2.

FIG. 4 shows a sectional view of a device 40 in accordance with the schematic diagram of FIG. 2. The sectional view of FIG. 4 is taken through the device as seen in FIG. 6 which is a schematic plan view of those parts of the device of FIG. 1 which are most relevant to the subject invention with emphasis upon the most important features of the device 40 from the point of view of understanding the present invention. Referring to FIG. 4 the device 40 is formed on a P- doped silicon semiconductor substrate 41. On the surface of semiconductor substrate 41 are formed two field oxide (FOX) regions 44 and 44' spaced along the surface of substrate 41, with a wide spaced therebetween. In the center of the substrate 41 between the FOX regions 44, 44' (replacing the central FOX region 14' in FIG. 3) is formed a gate oxide layer 42 upon which the gate 48 of transistor Qp is formed. Gate 48 is connected to ground potential Vss and node $N_G$ via a line $L_G$.

Adjacent to Vss line 48 and also formed above central field oxide region 44' are silicon dioxide spacers 52, 52' formed over substrate 41, by etching back a conventional blanket deposited silicon dioxide, dielectric spacer layer. Beneath spacers 52, 52' are formed lightly doped, N- regions 51, 51' which are doped with phosphorus. Between the FOX regions 44 and spacer 52, and between the FOX regions 44' and spacer 52' are formed doped N+ source/drain regions 54, 54' of transistor Qp doped with arsenic (As) which terminate in buried contact junction regions 56, 56' respectively which are doped N+ with phosphorus at the ends of regions 54, 54' which are farthest from gate 48.

Formed above the buried contact regions 56, 56' and FOX regions 44 and 44" are a pair of polysilicon 1 interconnection lines 46 (L1), 46' (L3) connected respectively from node $N_u$ to the gate of transistor Q1 on the left over FOX region 44 and from node $N_v$ to the gate of transistor Q3 on the right over FOX region 44". There are sidewalls of interconnection lines 46, 46' confronting the spacers 52. Spacers 52' are formed adjacent to the sidewalls of interconnection lines 46, 46'. Over the entire structure, as described above, is formed a conventional blanket interpolysilicon dielectric layer 58, preferably a silicon oxide (TEOS). Above the dielectric layer 58 is formed the high voltage line 62 (L5 at voltage Vcc) formed directly above the gate 48. The entire device 40 is then covered with a blanket BPSG or BPTEOS glass layer 64.

Resistors R1, R2, R3 and R4 are not seen in FIG. 4, but they can be seen in FIG. 6.

Line L5 goes over the top of the gate of transistor Qp, which is a common layout.

Since the value of voltage Vss is always reference potential or ground, the transistor Qp is always off because its gate is at ground. Thus there is no current flow and no short circuit. This solves the problem of buried contacts being shrunk by the central FOX region, which is omitted in this embodiment. The contact area is larger since the central FOX region 14' in FIG. 3 has been omitted in FIG. 4.

FIG. 6 shows a plan view of the device of FIGS. 2 and 4 with the various transistors Q1–Q8 and Qp the active areas the active areas OD1, OD2, and OD3 which with a merger of the original regions OD1 and OD2 at the OD1cross region, and resistors R1–R4.

The key feature of FIG. 6 is that a parasitic FET transistor Qp is formed at the junction of gate electrode line 48 with the source 54 and drain 54' described above in connection with FIG. 4 with the active areas OD1 and OD2 of FIG. 5 joined together as seen in FIG. 6.

Active area OD1 surrounds bit line contact BLC and passes by word line WL1 where transistor T6 is located. Next, active area OD1 passes by butt contact area BUT5. Next the active area OD1 passes by resistor R3 and line L1 where transistor T1 is located. Then active area OD1 passes by butt contact area BUT3, which is at one end of Vss line 18 and Vcc line 32 and continues past transistor T4 towards the upper end of line L4 and extends beyond buried contact BC1 across active area OD1cross region, where active area OD1 region joins what was previously the active area OD2. Active area OD1 is formed on the opposite side of Vss line 18 and Vcc line 32 where it connects to buried contact BC2 and extends across resistor R3 and line L2, where transistor T2 is formed. Then active area OD1 crosses the other end of Vss line 18 and Vcc line 32 passing by transistor T3, line L4, resistor R4 to butt contact area BUT1 and then by word line WL2 where transistor T8 is formed.

Active region OD2 passes by word line WL2 where transistor Q7 is formed and ends at resistor R43 and butt contact BUT2.

Active region OD3 passes by word line WL1 where transistor Q5 is formed and ends at resistor R3 and butt contact BUT4.

PROCESS OF MANUFACTURE

A gate oxide layer and FOX regions 44 and 44' are formed on the surface of P- doped semiconductor substrate 41 are formed two field oxide (FOX) regions 44 and 44' spaced along the surface of the substrate 41, with a wide space therebetween.

Between the FOX regions 44, 44' and a gate oxide layer 42 between FOX regions 44, 44' is formed by a conventional process of oxidation.

The process of forming the buried contact regions is as follows:

A thin split polysilicon layer is deposited after gate oxide formation. Buried contact holes are formed by using a mask for etching the split polysilicon and etching the gate oxide. A thick doped polysilicon or polycide layer is deposited after buried contact hole formation.

The chemical species of the dopant implanted in the buried contact regions is a material selected from the group consisting of phosphorus and arsenic, with a dose of between about 1E14 ions/cm$^{-2}$ and about 5E15 ions/cm$^{-2}$, at an energy of between about 10 keV and about 70 keV in an implanter tool.

A blanket polysilicon 1 layer is formed followed by formation of a mask for patterning the polysilicon 1 layer to form the gate 48 of transistor Qp and the interconnection lines 46, 46'.

Then a light doping process follows forming the N-regions 51, using the polysilicon 1 layer gate 48 and the interconnection lines 46, 46' as a self-aligned mask.

The chemical species of the dopant implanted in said lightly doped regions is a material selected from the group consisting of arsenic (As) and phosphorous (P), with a dose of between about 1E12 ions/cm$^{-2}$ and about 1E14 ions/cm$^{-2}$, at an energy of between about 10 keV and about 70 keV in an implanter tool.

Then, adjacent to the side walls of the gate 48 and the interconnection lines 46, 46' are formed silicon dioxide spacers 52, 52' over substrate 41, by etching back a conventional spacer, silicon dioxide, dielectric material.

Next, using the spacers 53, 52, 52' and 53' and polysilicon 1 layer gate 48 and the interconnection lines 46, 46' as a self-aligned mask, the source/drain regions 54, 54' are formed by ion implanting into the exposed surface of the substrate 41.

Over the entire structure as described above is formed a conventional blanket interpolysilicon dielectric layer 58, preferably a silicon oxide using a conventional TEOS deposition process. Above the dielectric layer 58 is formed the high voltage (polysilicon 2 layer) line 62 (L5 at voltage Vcc) formed directly above the gate 48. The polysilicon 2 layer is deposited in a blanket deposition and is patterned with a mask and etched to from line 62.

The chemical species of the dopant implanted in said source region and drain region is arsenic (As), with a dose of between about 1E15 ions/cm$^{-2}$ and about 7E15 ions/cm$^{-2}$, at an energy of between about 10 keV and about 70 keV in an implanter tool.

Then the entire device 40 is then covered with a blanket BPSG or BPTEOS glass layer 64.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. An SRAM silicon device comprising a set of cross-coupled inverters forming a bistable flip flop formed on a semiconductor substrate with a pair of FOX regions formed defining an area on the surface of a substrate comprising, said substrate composed of a semiconductor material, a pair of buried contact regions in said silicon substrate juxtaposed with said FOX regions, a control gate electrode of a parasitic FET device formed on a gate oxide layer on the surface of said substrate, a source region and drain region formed in said substrate juxtaposed with said control gate electrode and reaching to said buried contact regions, an interpolysilicon dielectric above said control gate electrode covering said device, and a polysilicon conductor formed over said gate.

2. An SRAM silicon device in accordance with claim 1 wherein said buried contacts were formed by ion implantation into said semiconductor substrate.

3. An SRAM silicon device in accordance with claim 1 wherein said gate oxide was formed on said substrate prior to formation of said gate.

4. An SRAM silicon device in accordance with claim 1 wherein said control gate electrode is connected to ground.

5. An SRAM silicon device in accordance with claim 1 wherein said control gate electrode of said transistor is connected to ground and the source and drain thereof are connected transversely in said device whereby said transistor is always off because its control gate electrode is at ground whereby there is no current flow and no short circuit.

6. An SRAM silicon device comprising a set of cross-coupled inverters forming a bistable flip flop formed on a semiconductor substrate with a pair of FOX regions formed defining an area on the surface of a substrate comprising, said substrate composed of a semiconductor material, a pair of buried contact regions in said silicon substrate juxtaposed with said FOX regions, a control gate electrode formed on a gate oxide layer on the surface of said substrate between said pair of said FOX regions, a source region and drain region formed in said substrate juxtaposed with said control gate electrode to form a parasitic FET device between said FOX regions, said source region and said drain region and reaching to separate ones of said buried contact regions, an interpolysilicon dielectric above said control gate electrode covering said device, and a conductor formed over said control gate electrode.

7. An SRAM silicon device in accordance with claim 6 wherein said conductor formed over said control gate electrode comprises the Vcc line of said device.

8. An SRAM silicon device in accordance with claim 6 wherein said device includes eight other FET device in said flip flop in addition to said parasitic FET device.

9. An SRAM silicon device in accordance with claim 8 wherein said conductor formed over said control gate electrode comprises the Vcc line of said device.

* * * * *